(12) United States Patent
Chang et al.

(10) Patent No.: US 7,670,102 B2
(45) Date of Patent: Mar. 2, 2010

(54) HEAT DISSIPATING MODULE

(75) Inventors: Bor-Haw Chang, Taipei (TW); Chu-Hsien Chou, Taipei (TW)

(73) Assignee: Asia Vital Components Co., Ltd., Taipei County (TW)

( * ) Notice: Subject to any disclaimer, the term of this patent is extended or adjusted under 35 U.S.C. 154(b) by 109 days.

(21) Appl. No.: 11/356,054

(22) Filed: Feb. 17, 2006

(65) Prior Publication Data
US 2007/0196203 A1 Aug. 23, 2007

(51) Int. Cl.
*F01D 1/36* (2006.01)
(52) U.S. Cl. .............................. 415/90; 415/203; 416/4
(58) Field of Classification Search ................... 415/90, 415/203; 416/4; 361/679.48, 678, 696, 697; 454/184
See application file for complete search history.

(56) References Cited

U.S. PATENT DOCUMENTS

| | | | |
|---|---|---|---|
| 2,632,598 A * | 3/1953 | Wales Jr. ......................... | 416/4 |
| 3,376,083 A * | 4/1968 | Muijderman ................ | 384/123 |
| 4,157,465 A | 6/1979 | Beardmore et al. | |
| 4,380,355 A | 4/1983 | Beardmore | |
| 5,419,679 A * | 5/1995 | Gaunt et al. ................... | 415/90 |
| 5,794,687 A * | 8/1998 | Webster et al. .............. | 165/121 |
| 6,166,904 A * | 12/2000 | Kitahara et al. ............. | 361/697 |
| 6,196,302 B1 * | 3/2001 | Chuang ...................... | 165/122 |
| 6,200,035 B1 | 3/2001 | Otsuki | |
| 6,659,169 B1 * | 12/2003 | Lopatinsky et al. ......... | 165/121 |
| 6,913,070 B2 * | 7/2005 | Wang et al. ................ | 165/80.3 |

FOREIGN PATENT DOCUMENTS

JP 08195456 A * 7/1996

OTHER PUBLICATIONS

Machine Translation of JP 8195456 A, produced Aug. 11, 2009.*

* cited by examiner

*Primary Examiner*—Edward Look
*Assistant Examiner*—Nathaniel Wiehe

(57) ABSTRACT

A heat dissipating module includes a rotational member, a stationary member and a driving member. The rotational member meshes with the driving member and has an uneven surface at a side thereof to space to the stationary member. The stationary member has plural flow passages and each flow passage has an air inlet at an end thereof and an air outlet at another end thereof. When the driving member actuates the rotational member to rotate with the fluid, the fluid enters the stationary member via the inlet and gathers at the outlet before being guided outward for concentrating the air and cooling the heat dissipated object.

3 Claims, 6 Drawing Sheets

HEAT DISSIPATING MODULE

BACKGROUND OF THE INVENTION

1. Field of the Invention

The present invention is related to a heat dissipating module particularly to a heat dissipating module, which includes a rotational member, a stationary member and a driving member to induce air for cooling heat dissipated object.

2. Brief Description of the Related Art

Currently, the central processing unit (CPU) is forced to dissipate heat with the axial flow fan or a centrifugal fan as shown in FIGS. 1 and 2. The CPU 11 is attached to a radiator 13 and an axial flow fan 12 is attached to the radiator 13. The axial flow fan 12 provides a fan blade section 121 to induce air flowing. Due to the heat generated by the CPU 11 not distributing to the surface thereof evenly, the central position has higher temperature than rest part of the CPU 11. However, the conventional axial flow fan 12 is usually mounted to right top of the CPU 11 and no air flows at the center of the axial flow fan 12 such that the axial flow fan 12 performs undesirable effect of heat dissipation for the CPU 11.

Referring to FIGS. 3 and 4, a radiator 23 is attached to the CPU 21 and a centrifugal fan 22 is provided in a groove 231 of the radiator 23. The centrifugal fan 22 provides a fan blade section 221 inside to induce air flowing. Due to the heat generated by the CPU 21 not distributing evenly at the surface thereof, the central position has higher temperature than rest part of the CPU 21. It can be seen in FIG. 4 that the centrifugal fan 22 is usually mounted to the groove 231, i.e., at the right top of the CPU 21 and the air induced by the centrifugal fan 22 only surrounds the centrifugal fan 21. Hence, the centrifugal fan 22 performs undesirable effect of heat dissipation for the CPU 21.

SUMMARY OF THE INVENTION

In order to solve the preceding problems, an object of the present invention is to provide a heat dissipating module structure, which includes a rotational member, a stationary member and a driving member, wherein, the stationary member has a plurality of flow passages and the rotational member induces fluid flowing into the flow passages via inlets of the flow passages and gathering at the outlets of the flow passages or the air outlet of the rotational member before being guided outward for cooling the heat dissipated object.

Another object of the present invention is to provide a heat dissipating module in which an uneven surface of the rotational member is applied to generate air to cool the heat dissipated object.

A further object of the present invention is to provide a heat dissipating module, which generates air based on the principle of fluid viscosity.

A further object of the present invention is to provide a heat dissipating module, which is capable of gathering the air to cool the heat dissipated object.

Accordingly, a heat dissipating module according to the present invention includes a rotational member, a stationary member and a driving member. The rotational member meshes with the driving member. The stationary member has plural flow passages and each flow passage has an air inlet at an end thereof. When the driving member actuates the rotational member to induce the fluid, the fluid enters the stationary member via the inlets and gathers at the outlets or an air outlet of the rotational member before being guided outward for concentrating the air and cooling the heat dissipated object.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
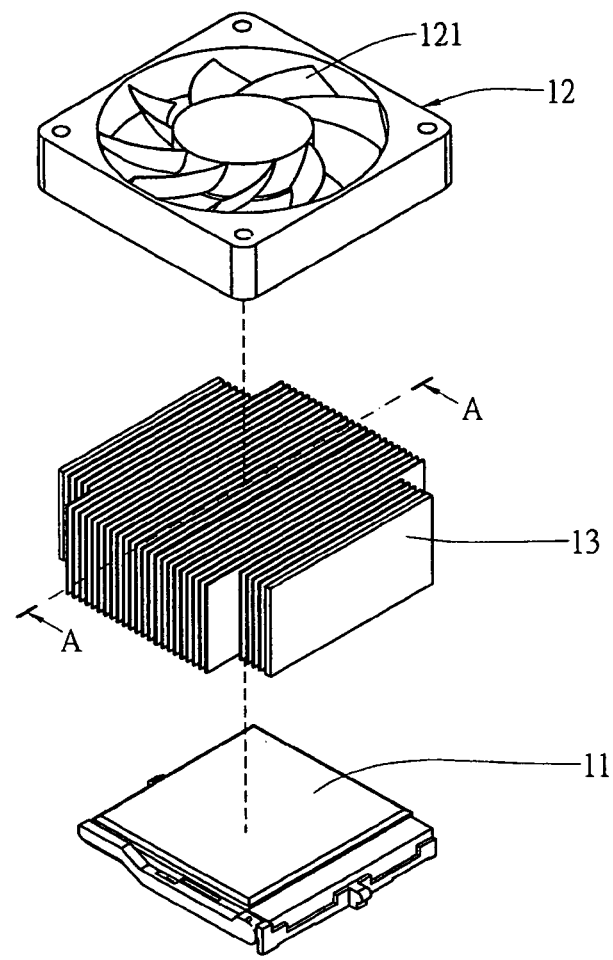
FIG. 1 is an exploded perspective view of the conventional axial flow fan.
Figure 2:
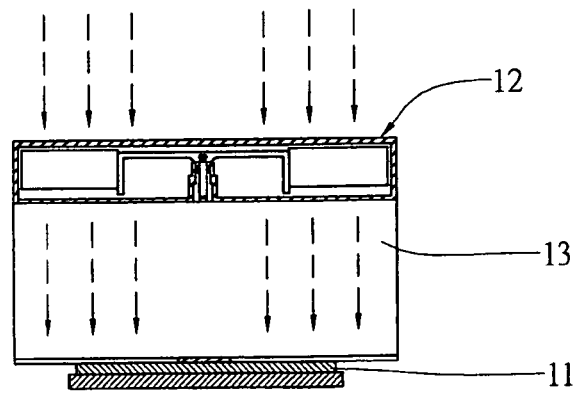
FIG. 2 is a sectional view along line A-A in FIG. 1.
Figure 3:
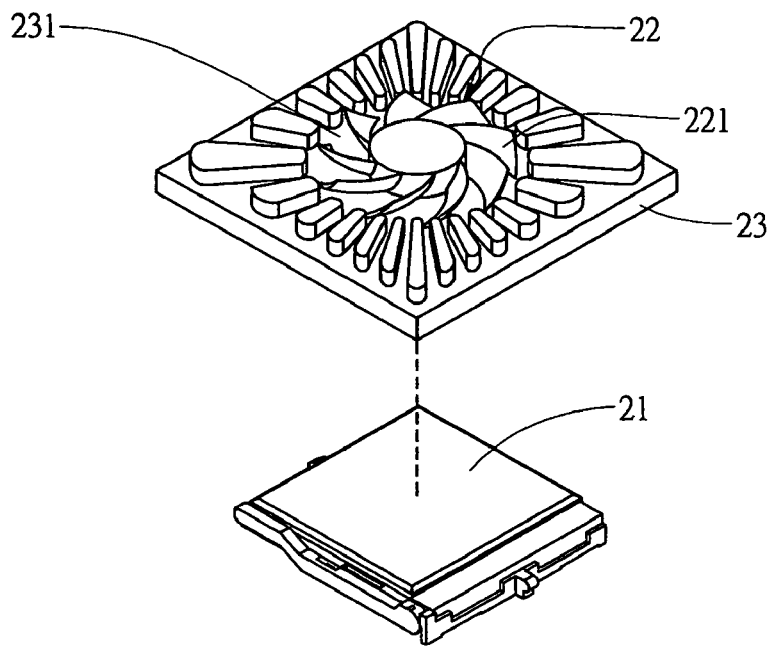
FIG. 3 is an exploded perspective view of the conventional centrifugal fan.
Figure 4:
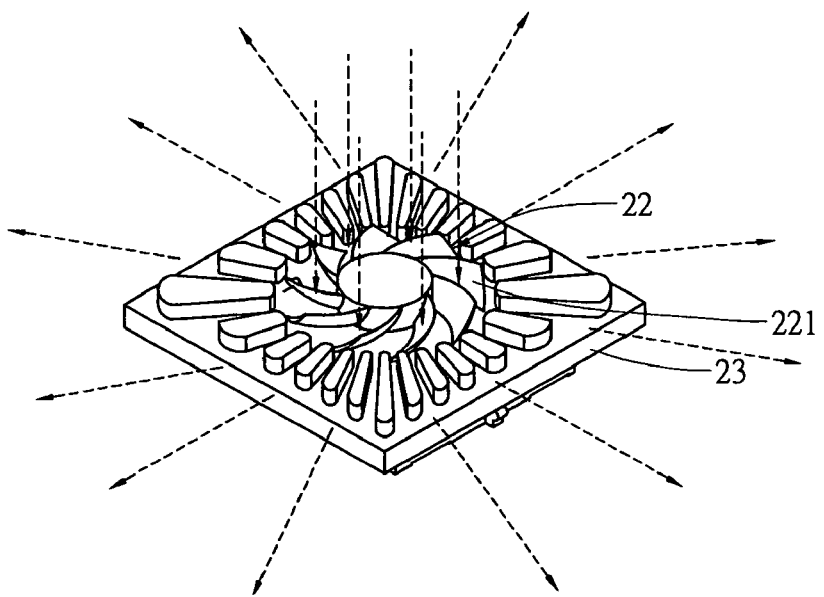
FIG. 4 is an assembled perspective view of the conventional centrifugal fan shown in FIG. 3.
Figure 5:
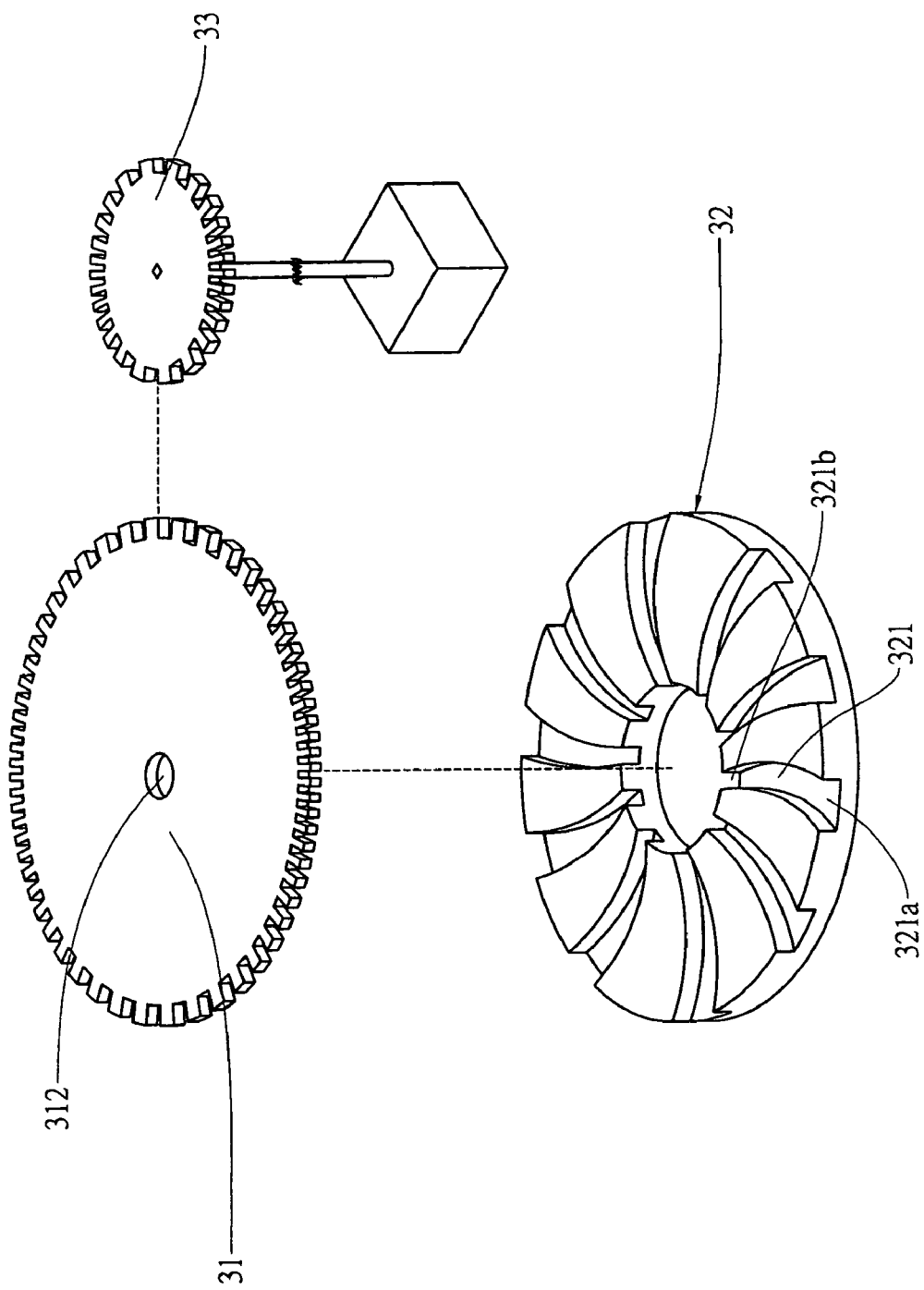
FIG. 5 is an exploded perspective view of the first embodiment of a heat dissipating module according to the present invention.
Figure 6:
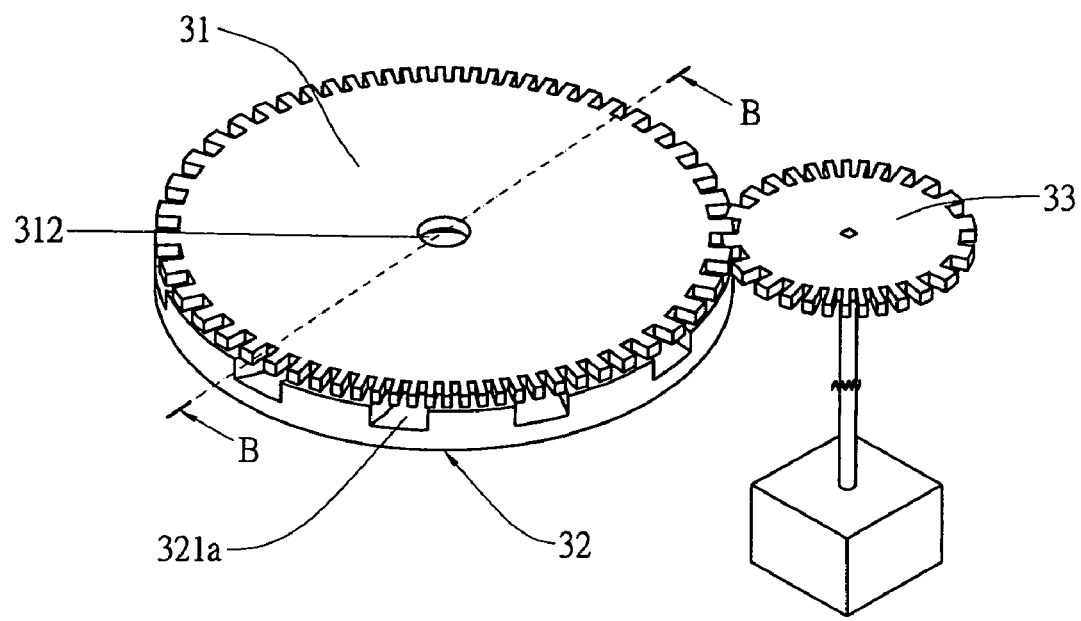
FIG. 6 is an assembled perspective view of the first embodiment of the present invention shown in FIG. 5.
Figures 7, 7A:
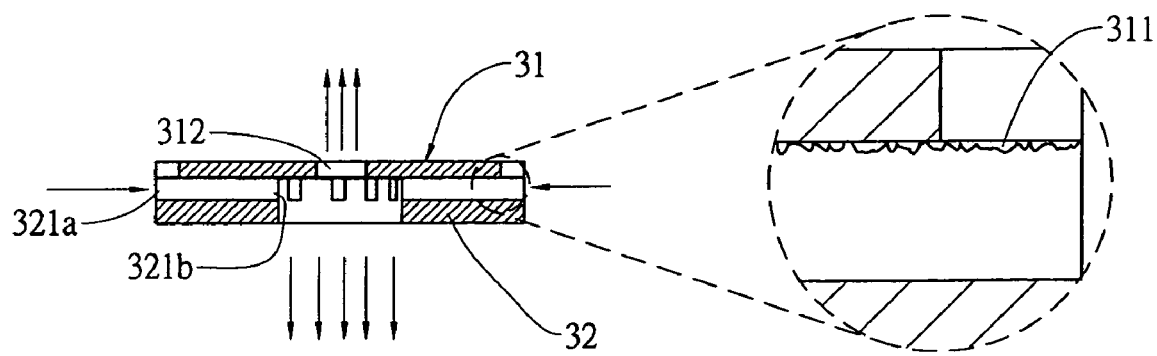
FIG. 7 is a sectional view along line B-B shown in FIG. 6.
FIG. 7A is an enlarged view of the dash line circle in FIG. 7 illustrating uneven surface clearly.

Referring to FIGS. 5 to 7, the first embodiment of a heat dissipating module according to the present invention includes a rotational member 31, a stationary member 32 and a driving member 33. The rotational member 31 is coupled to the driving member 33 and an uneven surface 311 is provided at a lateral side of the rotational member 31 as shown in FIG. 7A and the stationary member 32 is disposed to space the uneven surface 311. A plurality of flow passages 321 are provided at the stationary member 32 with an air inlet 321a being disposed at an end of each flow passage 321 and an air outlet 321b being disposed at another end of each flow passage 321.

It is known that ideal fluid is without viscosity and interruption between adjacent layers is unable to occur. However, the ordinary fluid is viscous such that when the driving member 33 actuates the rotational member 31 to rotate as shown in FIG. 7, the viscosity of the fluid allows the fluid to rotates with the rotational member 31. Meanwhile, the rotating fluid enters the inlets 321a of the flow passages 321 and discharges via the outlets 321b of the flow passages 321. In this way, the air is capable of gathering and cooling the heat dissipated object.

Referring to FIG. 5 again, the rotational member 31 provides a second air outlet 312 corresponding to the air outlet 321b such that it is capable of inducing air to another direction for cooling another heat dissipated object.

Figure 8:
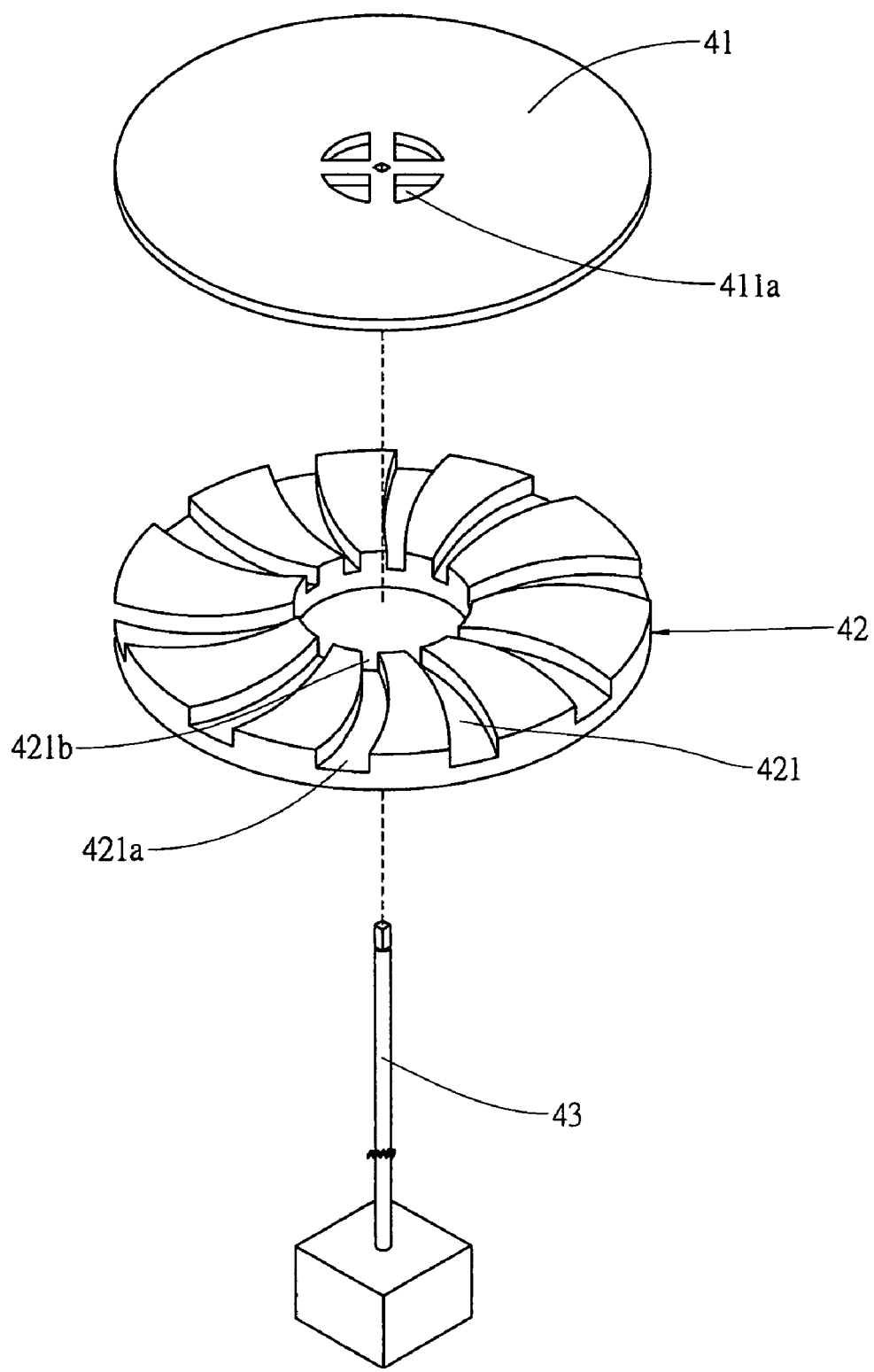
FIG. 8 is an exploded perspective view of the second embodiment of a heat dissipating module according to the present invention.
Figure 9:
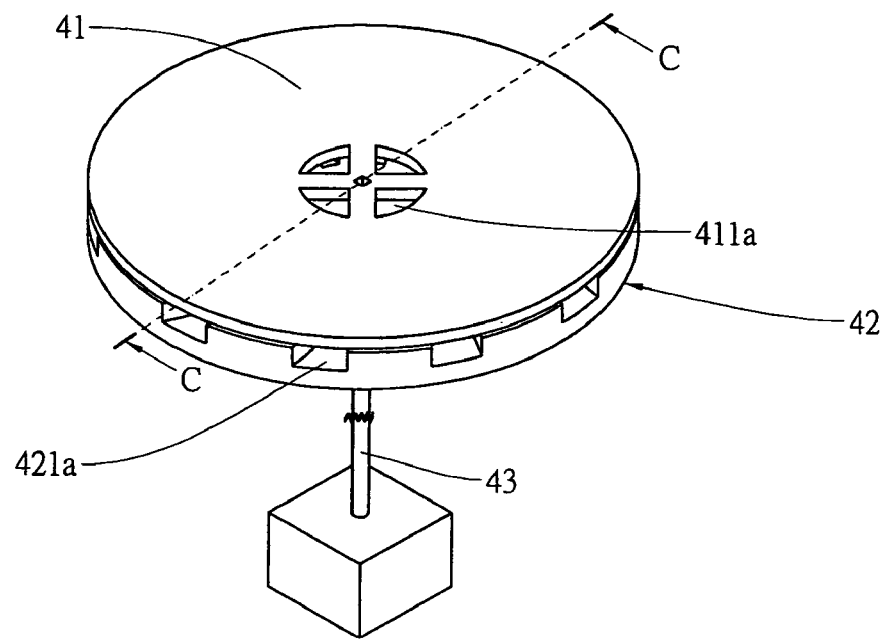
FIG. 9 is an assembled perspective view of the second embodiment according to the present invention.
Figures 10, 10A:
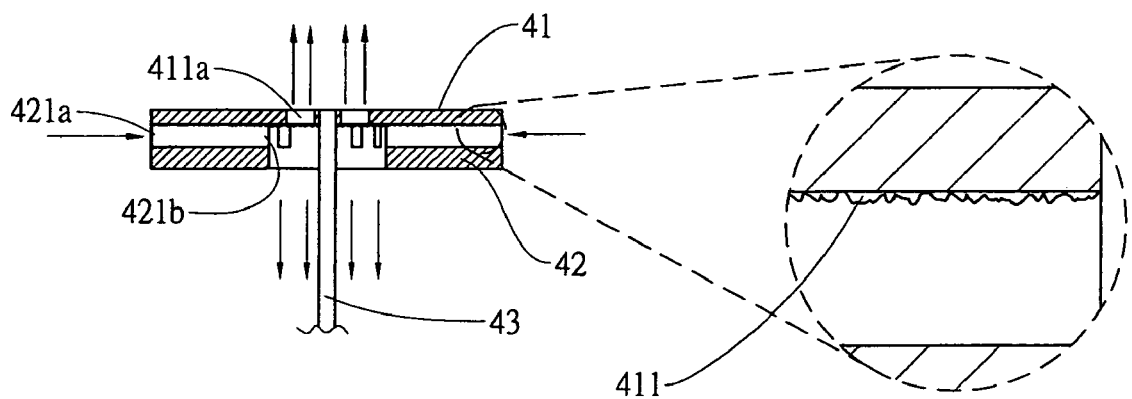
FIG. 10 is a sectional view along line C-C shown in FIG. 9.
FIG. 10A is an enlarged view of the dash line circle shown in FIG. 9.

Referring to FIGS. 8 to 10, the second embodiment of a heat dissipating module according to the present invention is illustrated. The second embodiment of the present invention includes a rotational member 41, a stationary member 42 and a driving member 43. The rotational member 41 is coupled to the driving member 43 and an uneven surface 411 is provided at a lateral side of the rotational member 41 as shown in FIG. 10A and the stationary member 42 is disposed to space the uneven surface 411. A plurality of flow passages 421 are provided at the stationary member 42 with an air inlet 421a being disposed at an end of each flow passage 421 and an air outlet 421b being disposed at another end of each flow passage 421.

It is known that ideal fluid is without viscosity and interruption between adjacent layers is unable to occur. However, the ordinary fluid is viscous such that when the driving member 43 actuates the rotational member 41 to rotate as shown in FIG. 10, the viscosity of the fluid allows the fluid rotates with the rotational member 41. Meanwhile, the rotating fluid enters the inlets 421a of the flow passages 421 and discharges via the outlets 421b of the flow passages 421. In this way, the air is capable of gathering and cooling the heat dissipated object.

Referring to FIG. 8 again, the rotational member 41 provides a second air outlet 411a corresponding to the air outlet 421b such that it is capable of inducing air to another direction for cooling another heat dissipated object.

Comparing to the conventional device, it is appreciated that the heat dissipating module of the present invention has the following advantages and effectiveness:

1. The fluid surrounding the rotational member can be guided by the flow passages via the inlets to gather at the outlets before being discharged due to the principle of viscosity of fluid.

2. The air induced by the rotational member can be concentrated toward the center of the stationary member via the flow passages to cool the high temperature location at the center of the heat dissipated object.

While the invention has been described with referencing to preferred embodiments thereof, it is to be understood that modifications or variations may be easily made without departing from the spirit of this invention, which is defined by the appended claims.

What is claimed is:

1. A heat dissipating module, comprising:
   a rotational member with an air outlet, the rotational member being substantially planar with an uneven surface where the air outlet is adjacent to a center of the rotational member;
   a stationary member, being disposed next to the rotational member with a plurality of flow passages and each of the flow passages having an air inlet at an end thereof and an air outlet at another end thereof;
   the rotational member air outlet corresponds to the stationary member air outlet, the air inlet being located on an outer surface of the stationary member; and
   a driving member, meshing with the rotational member.

2. The heat dissipating module as defined in claim 1, wherein the rotational member has an uneven surface at a side thereof facing the stationary member.

3. The heat dissipating module as defined in claim 1, wherein a space is provided between the rotational member and the stationary member.

* * * * *